(12) United States Patent
Yoshimura et al.

(10) Patent No.: US 10,263,162 B2
(45) Date of Patent: Apr. 16, 2019

(54) LIGHT EMITTING DEVICE AND IMAGE DISPLAYING SYSTEM

(71) Applicant: Sharp Kabushiki Kaisha, Sakai, Osaka (JP)

(72) Inventors: Kenichi Yoshimura, Sakai (JP); Tatsuya Ryohwa, Sakai (JP); Makoto Izumi, Sakai (JP); Noriyuki Yamazumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/874,019

(22) Filed: Jan. 18, 2018

(65) Prior Publication Data

US 2018/0240944 A1 Aug. 23, 2018

(30) Foreign Application Priority Data

Feb. 21, 2017 (JP) .................. 2017-030232

(51) Int. Cl.
| | |
|---|---|
| *H01L 33/00* | (2010.01) |
| *H01L 33/50* | (2010.01) |
| *H01L 33/56* | (2010.01) |
| *F21V 8/00* | (2006.01) |
| *H01L 33/48* | (2010.01) |
| *H01L 33/58* | (2010.01) |

(52) U.S. Cl.
CPC .......... *H01L 33/502* (2013.01); *H01L 33/501* (2013.01); *H01L 33/507* (2013.01); *H01L 33/56* (2013.01); *G02B 6/0073* (2013.01); *H01L 33/483* (2013.01); *H01L 33/58* (2013.01)

(58) Field of Classification Search
None
See application file for complete search history.

(56) References Cited

U.S. PATENT DOCUMENTS

| 6,501,091 B1 | 12/2002 | Bawendi et al. |
|---|---|---|
| 6,803,719 B1 | 10/2004 | Miller et al. |
| 2004/0259363 A1 | 12/2004 | Bawendi et al. |
| 2009/0014741 A1 | 1/2009 | Masuda et al. |
| 2010/0091215 A1 | 4/2010 | Fukunaga et al. |
| 2011/0043101 A1 | 2/2011 | Masuda et al. |
| 2013/0099213 A1* | 4/2013 | Jun .................. C09K 11/02 257/40 |
| 2013/0294048 A1 | 11/2013 | Asano et al. |

(Continued)

FOREIGN PATENT DOCUMENTS

| JP | 2005-277127 A | 10/2005 |
|---|---|---|
| JP | 2009-019163 A | 1/2009 |

(Continued)

*Primary Examiner* — Kevin M Picardat
(74) *Attorney, Agent, or Firm* — Keating & Bennett, LLP

(57) ABSTRACT

A light emitting device includes a light emitting element disposed on a substrate which emits blue light, a green phosphor that emits green light upon being excited by the blue light, a red phosphor that emits red light upon being excited by the blue light, and a transparent resin including the green phosphor and the red phosphor dispersed therein. The red phosphor is arranged to be in contact with the light emitting element and the substrate. The transparent resin includes a constitutional unit including an ionic liquid including a polymerizable functional group or a derivative of the ionic liquid.

20 Claims, 7 Drawing Sheets

(56) References Cited

U.S. PATENT DOCUMENTS

| | | | |
|---|---|---|---|
| 2014/0246689 A1 | 9/2014 | Luo et al. | |
| 2015/0291879 A1* | 10/2015 | Hong | H01L 33/502 257/98 |
| 2016/0049560 A1* | 2/2016 | Oh | H01L 33/504 257/98 |
| 2016/0087164 A1* | 3/2016 | Kawano | H01L 33/504 349/65 |
| 2016/0093776 A1* | 3/2016 | Setlur | C09K 11/617 257/98 |
| 2016/0268485 A1* | 9/2016 | Morimura | H01L 33/504 |
| 2016/0351757 A1 | 12/2016 | Yoshimura et al. | |
| 2017/0030532 A1 | 2/2017 | Ryohwa et al. | |
| 2017/0166807 A1 | 6/2017 | Kuzumoto et al. | |

FOREIGN PATENT DOCUMENTS

| | | |
|---|---|---|
| JP | 2010-093132 A | 4/2010 |
| JP | 2011-142336 A | 7/2011 |
| JP | 2012-163936 A | 8/2012 |
| JP | 2014-170938 A | 9/2014 |
| JP | 2016-219748 A | 12/2016 |
| JP | 2017-034076 A | 2/2017 |
| JP | 2017-110059 A | 6/2017 |
| WO | 2009/110285 A1 | 9/2009 |

* cited by examiner

|  | INITIAL LUMINOUS FLUX | LUMINOUS FLUX HALF-TIME |
|---|---|---|
| EXAMPLE D1 | 100 | 250 HOURS |
| EXAMPLE D2 | 98 | 500 HOURS |
| COMPARATIVE EXAMPLE D1 | 97 | 100 HOURS |
| COMPARATIVE EXAMPLE D2 | 80 | 2 HOURS |

| AdobeRGB COVERAGE | IMAGE DISPLAYING SYSTEM WHITE POINT | | | IMAGE DISPLAYING SYSTEM RED POINT | | IMAGE DISPLAYING SYSTEM GREEN POINT | | IMAGE DISPLAYING SYSTEM BLUE POINT | |
|---|---|---|---|---|---|---|---|---|---|
| | COLOR TEMPERATURE (K) | CIEx | CIEy | CIEx | CIEy | CIEx | CIEy | CIEx | CIEy |
| 97.7% | 10021.0 | 0.281 | 0.288 | 0.678 | 0.296 | 0.219 | 0.721 | 0.153 | 0.067 |

LIGHT EMITTING DEVICE AND IMAGE DISPLAYING SYSTEM

BACKGROUND

1. Field

The present disclosure relates to a light emitting device that includes a light emitting element and a wavelength converter and to an image displaying system that includes the light emitting device.

2. Description of the Related Art

There have been developed light emitting devices that include (i) a light emitting element, such as a light emitting diode (LED), and (ii) a wavelength converter that converts excitation light received from the light emitting element into fluorescence (e.g., a resin member including phosphor particles dispersed therein). Since the above light emitting devices are small and consume less power than incandescent lamps, they have been used as a light source included in an image displaying system or an illuminator.

The light emitting devices commonly include a blue LED and a yellow phosphor. As a yellow phosphor, a Ce-activated yttrium aluminum garnet (YAG) phosphor has been widely used because it has a high luminous efficiency.

In the case where the above light emitting device is used as a backlight of an image displaying system, the narrower the half-width of the emission spectrum of the phosphor, the wider the color reproduction area of the image displaying system. However, the half-width of the emission spectrum of a Ce-activated YAG phosphor is about 100 nm, which is relatively wide. Accordingly, using a semiconductor light emitting device that includes a Ce-activated YAG phosphor serving as a yellow phosphor as a liquid crystal backlight of an image displaying system may narrow the color reproduction area of the image displaying system.

Specifically, the above image displaying system is capable of covering substantially the entirety of the sRGB gamut, which is the gamut used in cathode ray tube (CRT) displays. However, the coverage at which the image displaying system covers the AdobeRGB gamut, which is the gamut used in wide-color-gamut liquid crystal displays, is significantly low.

More specifically, the gamut of an image displaying system that includes, as a liquid crystal backlight, a semiconductor light emitting device including a Ce-activated YAG yellow phosphor covers only about 70% of the AdobeRGB gamut. Therefore, the above semiconductor light emitting device is not suitable for wide-color-gamut liquid crystal displays.

The sRGB gamut is a gamut bordered with the triangle defined by the three chromaticity points (CIEx, CIEy)= (0.640, 0.330), (0.300, 0.600), and (0.150, 0.060) on the Commission Internationale de l'Eclairage (CIE) 1931 chromaticity diagram.

The AdobeRGB gamut is a gamut bordered with the triangle defined by the three chromaticity points (CIEx, CIEy)=(0.640, 0.330), (0.210, 0.710), and (0.150, 0.060) on the CIE 1931 chromaticity diagram. A comparison between the sRGB gamut and the AdobeRGB gamut shows that the AdobeRGB gamut has a wider range in some parts of the color reproduction area which correspond to green.

As a semiconductor light emitting device used as a backlight of a wide-color-gamut liquid crystal display capable of representing the AdobeRGB gamut, a semiconductor light emitting device that includes two phosphors with different colors, that is, a green phosphor and a red phosphor, is suitably used. The emission spectra of the phosphors may have a narrow half-width.

For example, International Publication No. WO2009/110285 (published Sep. 11, 2009; hereinafter, referred to as "PTL 1") and Japanese Unexamined Patent Application Publication No. 2010-93132 (published Apr. 22, 2010; hereinafter, referred to as "PTL 2") disclose a semiconductor light emitting device that includes an Eu-activated βSiAlON phosphor and $Mn^{4+}$-activated fluoride complex phosphor. An image displaying system that includes the above phosphors in combination has a wider color reproduction area than common image displaying systems that include a yellow phosphor.

This is because the emission spectrum of an Eu-activated βSiAlON phosphor and the emission spectrum of a $Mn^{4+}$-activated fluorine complex phosphor have a narrower half-width than the emission spectrum of a Ce-activated YAG phosphor. Specifically, the half-widths of the emission spectra of an Eu-activated βSiAlON phosphor and a $Mn^{4+}$-activated fluorine complex phosphor are 55 nm or less and 10 nm or less, respectively.

As described above, the half-width of the emission spectrum of an Eu-activated βSiAlON phosphor is 55 nm or less and is narrower than the half-width of the emission spectrum of a Ce-activated YAG yellow phosphor. However, using a $Mn^{4+}$-activated fluorine complex phosphor in combination with a phosphor having an emission spectrum with a further narrow half-width enables the production of an image displaying system having a further wide color reproduction area.

A known example of phosphors having an emission spectrum with a narrow half-width is a quantum dot phosphor. Japanese Unexamined Patent Application Publication No. 2014-170938 (published Sep. 18, 2014; hereinafter, referred to as "PTL 3") discloses a lighting device that includes a light source, a first phosphor layer disposed directly or indirectly on the top of the light source, a first quantum layer disposed directly on the top of the first phosphor layer, and a second phosphor layer disposed directly on the top of the first quantum layer. The first quantum layer is formed by mixing quantum dots diluted in an organic solvent with an uncured polymer matrix and drying the resulting mixed solution.

The first phosphor layer of the lighting device described in PTL 3 includes a phosphor uniformly dispersed therein. The heat generated by some of the particles of the phosphor which are located at a certain distance from the light source increases the temperature of the first phosphor layer. The heat transfers also to the quantum dots included in the first quantum layer adjacent to the first phosphor layer. Consequently, the quantum dots may become degraded by the heat.

SUMMARY

It is desirable to achieve a light emitting device and the like capable of reducing the degradation of a quantum dot phosphor.

According to an aspect of the disclosure, there is provided a light emitting device including a light emitting element that emits blue light; a substrate provided with the light emitting element disposed thereon; a quantum dot phosphor that emits green light upon being excited by the blue light; a $Mn^{4+}$-activated fluorine complex phosphor that emits red light upon being excited by the blue light; and a transparent resin including the light emitting element, the quantum dot phosphor, and the Mn$^{4+}$-activated fluorine complex phosphor, the light emitting element being disposed inside the transparent resin, the quantum dot phosphor and the Mn$^{4+}$-activated fluorine complex phosphor being dispersed in the transparent resin, the Mn$^{4+}$-activated fluorine complex phosphor being arranged to be in contact with the light emitting element and the substrate, the transparent resin including a constitutional unit including an ionic liquid including a polymerizable functional group or a derivative of the ionic liquid.

DESCRIPTION OF THE EMBODIMENTS

Embodiment 1

Embodiment 1 of the disclosure is described below with reference to FIGS. 1 to 7. In Embodiment 1, a light emitting device capable of reducing the degradation of a quantum dot phosphor is described.

Figure 1:
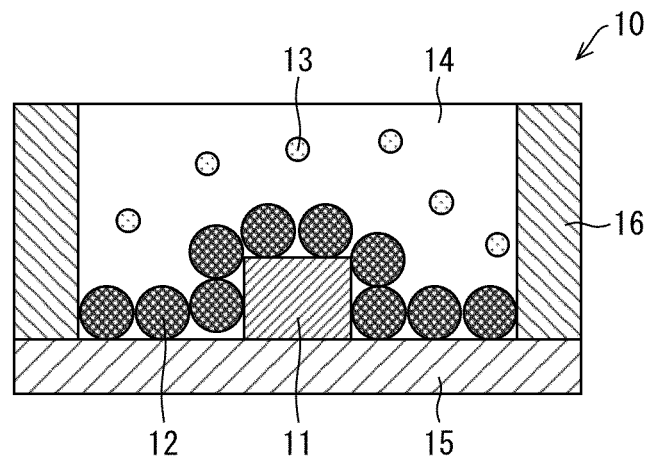
FIG. 1 is a cross-sectional view of a light emitting device according to Embodiment 1.

FIG. 1 is a cross-sectional view of a light emitting device 10 according to Embodiment 1. As illustrated in FIG. 1, the light emitting device 10 includes a light emitting element 11; a red phosphor 12, which is a Mn$^{4+}$-activated fluorine complex phosphor; a green phosphor 13, which is a quantum dot phosphor; a transparent resin 14; a substrate 15; and a resin frame 16.

Light Emitting Element 11

The light emitting element 11 is a light emitting element that emits blue light. The light emitting element 11 is not limited and may be any light emitting element capable of emitting primary light, that is, excitation light, that is absorbed by the red phosphor 12 and the green phosphor 13, which are described below, and causes fluorescence. The light emitting element 11 is, for example, a gallium nitride (GaN) semiconductor.

The peak wavelength of the primary light (i.e., excitation light) emitted from the light emitting element 11 is preferably about 420 nm or more and about 480 nm or less and is more preferably about 440 nm or more and about 460 nm or less. When the peak wavelength of the primary light (i.e., excitation light) falls within the range of about 420 nm or more and about 480 nm or less, the light emitting element 11 has a high luminous efficiency. When the peak wavelength of the primary light (i.e., excitation light), is about 440 nm or more and about 460 nm or less, the light emitting element 11 has a particularly high luminous efficiency. Furthermore, in such a case, the peak wavelength of the primary light is coherent with the excitation spectrum of the red phosphor 12 described below and the transmission spectrum of the blue color filter 246b described below. This increases the luminous efficiency of the light emitting device 10.

Red Phosphor 12

The red phosphor 12 is a Mn$^{4+}$-activated fluorine complex phosphor that emits red light upon being excited by blue light emitted from the light emitting element 11. The half-width of the emission spectrum of red light emitted from a Mn$^{4+}$-activated fluorine complex phosphor is 10 nm or less, which is markedly narrow. Therefore, the light emitting device 10 according to Embodiment 1 has high color reproducibility in the red region.

Examples of a Mn$^{4+}$-activated fluorine complex phosphor used as the red phosphor 12 include phosphors represented by General Formulae (A) and (B) below. The half-width of the emission spectrum of a Mn$^{4+}$-activated fluorine complex phosphor is 10 nm or less and markedly narrow as described above, regardless of whether the Mn$^{4+}$-activated fluorine complex phosphor is represented by General Formula (A) or (B). This is because of the properties of Mn$^{4+}$, which is a light emitting ion.

$$MI_2(MII_{1-h}Mn_h)F_6 \qquad (A)$$

In General Formula (A) above, MI represents at least one alkali metal element selected from Li, Na, K, Rb, and Cs; MII represents at least one tetravalent metal element selected from Ge, Si, Sn, Ti, and Zr; and h may be about 0.001 or more and about 0.1 or less.

In General Formula (A), MI may be K. In such a case, the Mn$^{4+}$-activated fluorine complex phosphor has a high emission intensity and the stability of crystals of the phosphor becomes enhanced. For the same reasons as above, MII may include Ti or Si.

In General Formula (A), h represents the compositional proportion (i.e., concentration) of Mn, that is, the concentration of Mn$^{4+}$. If h is less than about 0.001, the Mn$^{4+}$-activated fluorine complex phosphor may have an insufficient luminosity as a result of an insufficient concentration of Mn$^{4+}$, which is a light emitting ion. On the other hand, if h exceeds about 0.1, the luminosity of the Mn$^{4+}$-activated fluorine complex phosphor may be significantly reduced as a result of concentration quenching or the like.

That is, the Mn$^{4+}$-activated fluorine complex phosphor represented by General Formula (A) may be K$_2$(Ti$_{1-h}$Mn$_h$)F$_6$ or K$_2$(Si$_{1-h}$Mn$_h$)F$_6$, where h is about 0.001 or more and about 0.1 or less.

$$MIII(MII_{1-h}Mn_h)F_6 \qquad (B)$$

In General Formula (B) above, MIII represents at least one alkaline-earth metal element selected from Mg, Ca, Sr, and Ba; MII represents at least one tetravalent metal element selected from Ge, Si, Sn, Ti, and Zr; and h may be about 0.001 or more and about 0.1 or less.

In General Formula (B), MIII may include at least Ba. In such a case, the phosphor has a high luminous efficiency and is resistant to degradation due to heat and external forces. For the same reasons as above, MII may include Ti or Si.

In particular, MII may be Si. In such a case, the Mn$^{4+}$-activated fluorine complex phosphor has a low solubility in water and high water resistance regardless of whether the phosphor is represented by General Formula (A) or (B). In General Formula (B), h represents the compositional proportion (i.e., concentration) of Mn and may be about 0.001 or more and about 0.1 or less as in General Formula (A) above.

In Embodiment 1, the particle diameter of the red phosphor 12 is preferably about 10 μm or more and is more preferably about 30 μm or more. Setting the particle diameter of the red phosphor 12 to fall within the above range may facilitate the settling of the red phosphor 12 in an ionic liquid in the preparation of the transparent resin 14 described below.

The particle diameter of the red phosphor 12 may be about 100 μm or less. If the particle diameter of the red phosphor 12 exceeds about 100 μm, clogging may occur in a dispenser used for filling the resin frame 16 with an ionic liquid including the red phosphor 12 dispersed therein, which reduces the mass productivity of the light emitting device 10.

Green Phosphor 13

The green phosphor 13 is a phosphor that emits green light upon being excited by blue light emitted from the light emitting element 11. The peak wavelength of the emission spectrum of green light emitted from the green phosphor 13 may be about 520 nm or more and about 540 nm or less. If the peak wavelength of the emission spectrum of the green phosphor 13 is less than about 520 nm or more than about 540 nm, an image displaying system that includes the light emitting device 10 as a backlight may have poor color reproducibility, such as a low AdobeRGB gamut coverage.

A quantum dot phosphor may be used as the green phosphor 13 in order to make the color reproduction area in the green region wider than the color reproduction areas of the semiconductor light emitting devices described in PTL 1 and PTL 2. The half-width of the emission spectrum of a quantum dot phosphor can be narrowed to, in theory, about 15 nm by reducing fluctuations in the size of the quantum dots. A green phosphor having a narrow half-width of about 40 nm or less has been realized.

Thus, using a quantum dot phosphor as the green phosphor 13 makes it possible to widen the color reproduction area in the green region compared with the light emitting devices described in PTL 1 or PTL 2, which include a green phosphor having an emission spectrum with a half-width of about 55 nm.

In Embodiment 1, the half-width of the emission spectrum of the green phosphor 13 is about 25 nm or more. This widens the range of acceptable fluctuations in the particle diameter of the green phosphor 13 in the production of the green phosphor 13 and, consequently, increases the production yield of the green phosphor 13. As a result, the production costs of the green phosphor 13 and, in turn, the production costs of the light emitting device 10 may be reduced.

In Embodiment 1, as described above, the half-width of the emission spectrum of the red phosphor 12 is about 10 nm or less, which is markedly narrow. Therefore, even when the half-width of the emission spectrum of the green phosphor 13 is widened, the overlap between the emission spectrum of the green phosphor 13 and the emission spectrum of the red phosphor 12 is small and, accordingly, the color reproducibility of an image displaying system that includes the light emitting device 10 does not become degraded significantly. Specifically, it is possible to produce an image displaying system having high color reproducibility even when the half-width of the emission spectrum of the green phosphor 13 is limited to be about 25 nm or more.

The semiconductor crystal material constituting the quantum dot phosphor that serves as the green phosphor 13 may be a phosphor material capable of emitting visible light with efficiency. Examples of such a material include II-VI compound semiconductors, Group-III nitride semiconductors, and chalcopyrite materials. Specifically, the quantum dot phosphor may be composed primarily of any one selected from CdSe, CdS, CdTe, InP, InN, AlInN, InGaN, AlGaInN, and CuInGaSe.

By changing the particle diameter or the composition of the quantum dot phosphor, the energy band gap of the quantum dot phosphor can be adjusted in order to extract fluorescence having various wavelengths.

Ionic Surface-Modifying Molecule 13a

Figure 2:
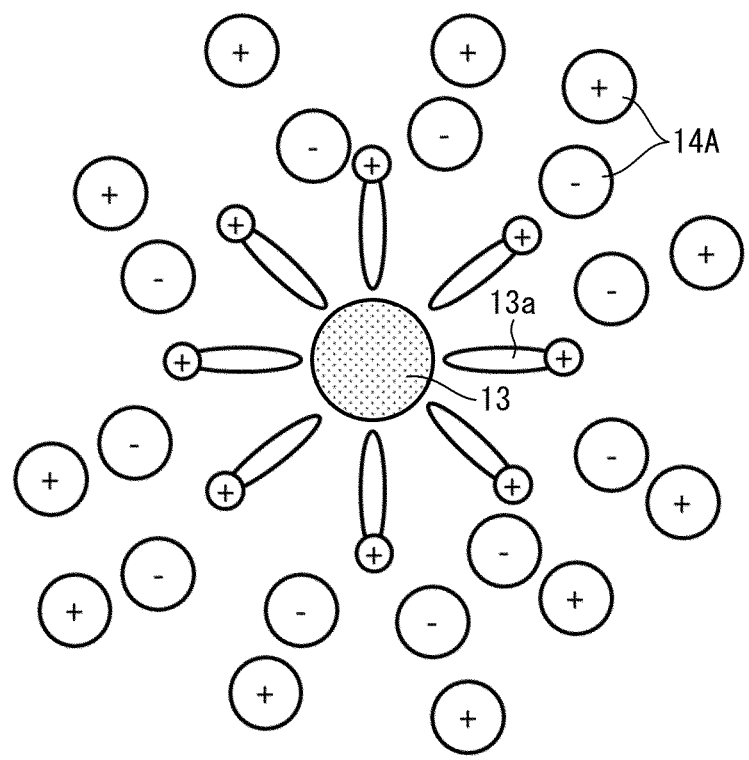
FIG. 2 is a schematic diagram illustrating a green phosphor provided with ionic surface-modifying molecules bonded to the surface thereof.

FIG. 2 is a schematic diagram illustrating a green phosphor 13 provided with ionic surface-modifying molecules 13a bonded to the surface thereof. In Embodiment 1, the green phosphor 13 may be provided with ionic surface-modifying molecules 13a bonded to the surface thereof as illustrated in FIG. 2. The ionic surface-modifying molecules 13a are polar molecules bonded to the surface of the green phosphor 13 on the cathodic side.

It is possible to firmly protect the green phosphor 13 while the green phosphor 13 is electrostatically stabilized in the transparent resin 14 by (i) bonding the ionic surface-modifying molecules 13a to the surface of the green phosphor 13, (ii) dispersing the green phosphor 13 in an ionic liquid 14A including a polymerizable functional group, and (iii) polymerizing the resulting dispersion liquid to prepare a transparent resin 14 including a constitutional unit including the ionic liquid 14A including a polymerizable functional group or a derivative of the ionic liquid 14A. This reduces the likelihood of the ionic surface-modifying molecules 13a becoming detached from the surface of the green phosphor 13 by heat and, consequently, the degradation of the green phosphor 13.

The above ionic surface-modifying molecules 13a may be any known ionic surface-modifying molecules. Specific examples of the ionic surface-modifying molecules 13a include the following:

2-(Diethylamino)ethanethiol hydrochloride
Hexadecyltrimethylammonium bromide
Myristyltrimethylammonium bromide
Thioglycolate
Thiocholine bromide Among the above compounds, in particular, any compound selected from the group consisting of the following compounds, which are cationic surface modifiers capable of bonding to the green phosphor 13 with further stability, may be used as the ionic surface-modifying molecules 13a.

2-(Diethylamino)ethanethiol hydrochloride
Hexadecyltrimethylammonium bromide
Myristyltrimethylammonium bromide
Thiocholine bromide In the case where, for example, 2-(diethylamino)ethanethiol hydrochloride is used as the ionic surface-modifying molecules 13a, the ionic surface-modifying molecules 13a may be bonded to the green phosphor 13 by the following methods:

A method in which 2-(diethylamino)ethanethiol hydrochloride is used as a surface modifier in the preparation of the green phosphor 13

A method in which 2-(diethylamino)ethanethiol hydrochloride is used subsequent to the preparation of the green phosphor 13

The amount of ionic surface-modifying molecules 13a added to the green phosphor 13 is not limited but preferably 0.1 to 100 parts by weight and is more preferably 1 to 50 parts by weight relative to 100 parts by weight of the green phosphor 13. If the amount of ionic surface-modifying molecules 13a added to the green phosphor 13 is less than 0.1 parts by weight relative to 100 parts by weight of the green phosphor 13, the surface of the green phosphor 13 may fail to be sufficiently modified with the ionic surface-modifying molecules 13a. If the amount of ionic surface-modifying molecules 13a added to the green phosphor 13 is more than 100 parts by weight relative to 100 parts by weight of the green phosphor 13, the excessive amount of ionic surface-modifying molecules 13a may cause coagulation of the green phosphor 13.

Transparent Resin 14

The transparent resin 14 is a resin that includes the light emitting element 11 disposed therein and the green phosphor 13 and the red phosphor 12 that are dispersed in the transparent resin 14. The transparent resin 14 includes a constitutional unit that includes an ionic liquid including a polymerizable functional group or a derivative of the ionic liquid.

The above-described transparent resin 14 is stable to heat and has a high affinity to the quantum dot phosphor. This makes the interface between the green phosphor 13 and the transparent resin 14 chemically stable. In the light emitting device 10, the green phosphor 13 is dispersed in the transparent resin 14. This protects the green phosphor 13 with the transparent resin 14 and, in particular, reduces the degradation of the green phosphor 13 by heat.

The constituent elements of the transparent resin 14 include sulfur as described below. Accordingly, if the transparent resin 14 is brought into contact with metal parts of the light emitting element 11 or the substrate 15, such as an electrode, the metal parts may be sulfurized. Sulfurization of the metal parts results in reductions in the electric conductivity, the reflectivity, and the like of the metal parts and, consequently, significantly reduces the luminous efficiency of the light emitting device 10.

In the light emitting device 10, as illustrated in FIG. 1, the red phosphor 12 composed of a stable inorganic substance is arranged so as to be in contact with the light emitting element 11 and the substrate 15. This prevents the above metal parts from coming into contact with the transparent resin 14 and being sulfurized by the contact and consequently limits a reduction in the luminous efficiency of the light emitting device 10.

The red phosphor 12 may be arranged within a predetermined distance from the light emitting element 11 and the substrate 15 such that some of the particles of the red phosphor 12 come into contact with the light emitting element 11 or the substrate 15 and the other particles face the light emitting element 11 and the substrate 15. In such a case, the larger the area of a portion of the red phosphor 12 which comes into contact with the light emitting element 11 and the substrate 15, the higher the efficiency with which the heat generated in the red phosphor 12 is dissipated. The above arrangement of the red phosphor 12 may be described that the red phosphor 12 covers the light emitting element 11 and the substrate 15.

The ionic liquid used for forming the transparent resin 14 used in Embodiment 1 contains a salt that is in a molten state at room temperature (e.g., 25° C.), that is, an ambient temperature molten salt, which may be represented by General Formula (I) below:

$$X^+Y^- \qquad (I)$$

In General Formula (I), X⁺ may be any one selected from the following cations.

Imidazolium ion
Pyridinium ion
Phosphonium ion
Aliphatic quaternary ammonium ion
Pyrrolidinium
Sulfonium Among the above cations, in particular, an aliphatic quaternary ammonium ion may be used, because it is stable to heat and air.

In General Formula (I), Y⁻ may be any one selected from the following anions.

Tetrafluoroborate ion
Hexafluorophosphate ion
Bistrifluoromethylsulfonylimidate ion
Perchlorate ion
Tris(trifluoromethylsulfonyl)carbon acid ion
Trifluoromethanesulfonate ion
Trifluoroacetate ion
Carboxylate ion
Halogen ion Among the above anions, in particular, a bistrifluoromethylsulfonylimidate ion may be used, because it is stable to heat and air.

As described above, the transparent resin 14 includes a constitutional unit including the ionic liquid including a polymerizable functional group or a derivative of the ionic liquid. The transparent resin 14 is formed by polymerizing the ionic liquid in which the red phosphor 12 is settled and the green phosphor 13 is dispersed. In the formation of the transparent resin 14, it is possible to reduce coagulation or the like of the green phosphor 13, which may occur, for example, when a silicone resin including the green phosphor 13 dispersed therein becomes solidified.

Dispersing the green phosphor 13 in the transparent resin 14 makes the green phosphor 13 electrostatically stable and firmly protects the surface of the green phosphor 13 from air, moisture, and the like. This increases the luminous efficiency of the light emitting device 10.

The polymerizable functional group included in the ionic liquid may be, but is not limited to, a (meth)acrylic acid ester group, that is, a (meth)acryloyloxy group, in order to make it possible to solidify the transparent resin 14 while the green phosphor 13 is dispersed in the transparent resin 14.

Examples of the ionic liquid including a (meth)acrylic acid ester group include 2-(methacryloyloxy)-ethyltrimethylammonium bis(trifluoromethanesulfonyl)imide represented by Formula (1) below and 1-(3-acryloyloxy-propyl)-

3-methylimidazolium bis(trifluoromethanesulfonyl)imide represented by Formula (2) below, which are highly stable to heat and air.

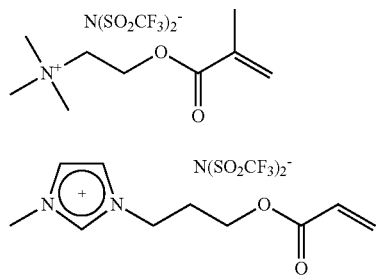

The above ionic liquid including a polymerizable functional group may be produced by introducing the polymerizable functional group into a known ionic liquid by a known method. The ionic liquid including a polymerizable functional group may be a commercial ionic liquid.

The conditions, such as temperature and time, under which the ionic liquid including a polymerizable functional group is polymerized while the green phosphor 13 is dispersed in the ionic liquid are not limited and may be selected appropriately in accordance with the type and amount of the ionic liquid used. For example, when 2-(methacryloyloxy)-ethyltrimethylammonium bis(trifluoromethanesulfonyl)imide is used as an ionic liquid, the ionic liquid can be suitably polymerized at 60° C. to 100° C. for 1 to 10 hours. In another case, when 1-(3-acryloyloxy-propyl)-3-methylimidazolium bis(trifluoromethanesulfonyl)imide is used as an ionic liquid, the ionic liquid can be suitably polymerized at 60° C. to 150° C. for 1 to 10 hours.

In the case where a catalyst is used for polymerizing the ionic liquid, the catalyst is not limited and the following known catalysts may be used.

Azobisisobutyronitrile
Dimethyl 2,2'-azobis(2-methylpropionate)

Among the above catalysts, azobisisobutyronitrile may be used in order to increase polymerization rate.

In the case where a crosslinking agent is added to the ionic liquid, the amount of crosslinking agent added to the ionic liquid is preferably, but not limited to, 1 to 50 parts by weight and is more preferably 10 to 30 parts by weight relative to 100 parts by weight of the ionic liquid. If the amount of crosslinking agent added to the ionic liquid is less than 1 part by weight relative to 100 parts by weight of the ionic liquid, a sufficient crosslinked structure may fail to be formed and, consequently, the strength of the transparent resin 14 may be reduced. If the amount of crosslinking agent added to the ionic liquid is more than 50 parts by weight relative to 100 parts by weight of the ionic liquid, the green phosphor 13 may fail to be dispersed in the transparent resin 14 with stability.

Other Components of Light Emitting Device 10

The substrate 15 is a printed wiring board on which the light emitting element 11 is disposed and in which an electric circuit that drives the light emitting element 11 is formed. The resin frame 16 is a frame made of a resin which is disposed on the substrate 15.

Production Example of $Mn^{4+}$-Activated Fluorine Complex Phosphor

Figure 3:
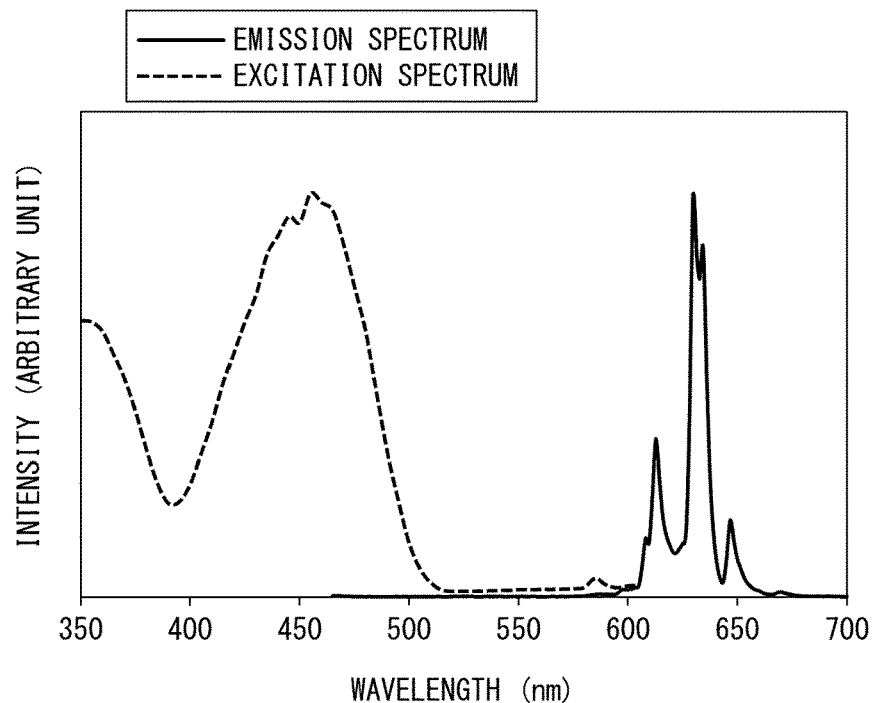
FIG. 3 is a graph illustrating the emission and excitation spectra of a Mn$^{4+}$-activated fluorine complex phosphor prepared in a production example of Embodiment 1.

A production example of the $Mn^{4+}$-activated fluorine complex phosphor used as the red phosphor 12 is described below with reference to FIG. 3. FIG. 3 is a graph illustrating the emission and excitation spectra of a $Mn^{4+}$-activated fluorine complex phosphor prepared in the production example described below. In this production example, a $Mn^{4+}$-activated fluorine complex phosphor represented by General Formula (A) above in which MI represents K, MII represents Si, and h is 0.06 was prepared.

A partition (i.e., diaphragm) made of an ion-exchange fluororesin membrane was disposed at the center of a reaction vessel made of a vinyl chloride resin. An anode and a cathode, which were platinum plates, were disposed in the respective chambers of the reaction vessel which faced each other across the ion-exchange membrane. An aqueous hydrofluoric acid solution containing manganese(II) fluoride dissolved therein and an aqueous hydrofluoric acid solution were charged into the anode-side and cathode-side chambers of the reaction vessel, respectively.

The anode and the cathode were connected to a power source. Electrolysis was performed at a voltage of 3 V and a current of 0.75 A. After the electrolysis had been finished, a solution prepared by dissolving potassium fluoride in an aqueous hydrofluoric acid solution to saturation was added to the reaction solution contained in the anode-side chamber in an excessive amount in order to form $K_2MnF_6$ in the form of a yellow solid substance. The solid substance was filtered off and collected. Hereby, $K_2MnF_6$ was prepared.

Subsequently, 4.8 g of silicon dioxide was dissolved in 100 $cm^3$ of a 48-mass % aqueous hydrofluoric acid solution to form an aqueous solution containing silicon fluoride. After the aqueous solution had been cooled to room temperature by radiational cooling, the aqueous solution was charged into a resin container with a lid. The container was held for 1 hour or more in a water bath kept at 70° C. in order to heat the aqueous solution. To the aqueous solution containing silicon fluoride, 1.19 g of the powder of $K_2MnF_6$ prepared above was added. The resulting mixture was stirred to form a solution. Hereby, an aqueous solution containing silicon fluoride and $K_2MnF_6$ was prepared (hereinafter, this aqueous solution is referred to as "first solution").

Then, 13.95 g of potassium fluoride was dissolved in 40 $cm^3$ of a 48-mass % aqueous hydrofluoric acid solution. The resulting solution was cooled to room temperature by radiational cooling. Hereby, an aqueous solution containing potassium fluoride was prepared (hereinafter, this aqueous solution is referred to as "second solution").

While the first solution was stirred, the second solution was added to the first solution gradually in small amounts over about 2.5 minutes. The resulting mixed solution was stirred for about ten minutes to form a light orange solid substance. The solid substance was filtered off and subsequently cleaned with a small amount of a 20-mass % aqueous hydrofluoric acid solution. After the cleaned solid substance had been further cleaned with ethanol, it was dried in vacuum. Hereby, 15.18 g of a $Mn^{4+}$-activated fluorine complex phosphor was prepared.

The X-ray diffraction pattern of the $Mn^{4+}$-activated fluorine complex phosphor was determined with an X-ray diffractometer produced by Rigaku Corporation by using Cu-Kα radiation. The results of the analysis confirmed the formation of the $K_2SiF_6$ phase.

The emission spectrum of the $Mn^{4+}$-activated fluorine complex phosphor was measured. Specifically, the $Mn^{4+}$-activated fluorine complex phosphor was most closely packed in a quartz cell having a width of 10 mm, a length of 10 mm, and a depth of 50 mm by tapping. The emission spectrum of the $Mn^{4+}$-activated fluorine complex phosphor packed in the quartz cell which occurred upon the $Mn^{4+}$- activated fluorine complex phosphor being excited by light with a wavelength of 445 nm was measured with a spectrofluorometer "Fluoromax4" produced by Horiba, Ltd.

In FIG. 3, the emission spectrum of the $Mn^{4+}$-activated fluorine complex phosphor is denoted by the solid line. An analysis of the emission spectrum illustrated in FIG. 3 shows that the emission spectrum of the $Mn^{4+}$-activated fluorine complex phosphor had a peak wavelength of 630 nm and a half-width of 8 nm.

Figure 4:
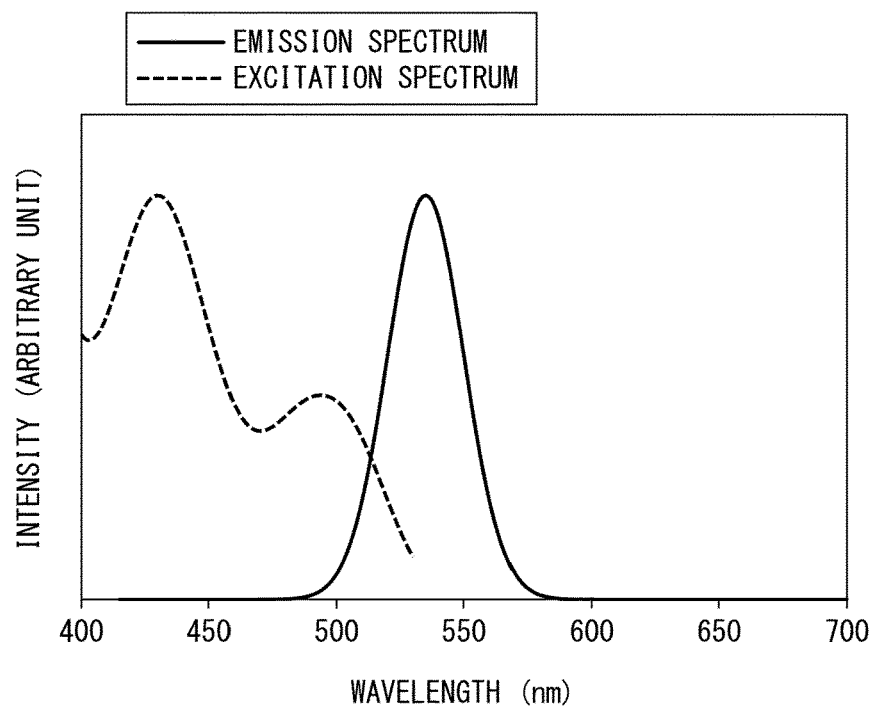
FIG. 4 is a graph illustrating the emission and excitation spectra of a quantum dot phosphor prepared in a production example of Embodiment 1.

While the wavelength of the excitation light was changed, the emission intensity of the $Mn^{4+}$-activated fluorine complex phosphor at the peak wavelength of 630 nm was plotted against the excitation wavelength in order to form the excitation spectrum shown in FIG. 3 by a dashed line.
Production Example of Quantum Dot Phosphor A production example of the quantum dot phosphor used as the green phosphor 13 is described below with reference to FIG. 4. FIG. 4 is a graph illustrating the emission and excitation spectra of a quantum dot phosphor prepared in the production example below.

The method for preparing the quantum dot phosphor is not limited, and known methods for producing a quantum dot phosphor may be used. The quantum dot phosphor may be prepared by chemical synthesis, which is simple and reduces the production costs. In chemical synthesis, a plurality of starting materials that include constituent elements of the substance that is to be produced are dispersed in a medium and reacted with one another to produce the substance.

Examples of the chemical synthesis include a sol-gel method (i.e., colloidal method), a hot-soap method, a reverse-micelle method, a solvothermal method, a molecular precursor method, a hydrothermal synthesis method, and a flux method. A hot-soap method may be used in order to produce semiconductor nanoparticles composed of a compound semiconductor material in a suitable manner.

An example method in which particles of a quantum dot phosphor that are CdSe/ZnS semiconductor nanoparticles each constituted by a CdSe core and a ZnS shell are produced by a hot-soap method is described below.

First, the CdSe core was synthesized. With 3 ml of trioctylphosphine (TOP), 1 mmol of trioctylphosphine selenide (TOPSe) and 1 mmol of dimethylcadmium were mixed in an inert atmosphere to form a mixed solution.

To the mixed solution heated at 350° C. in a nitrogen atmosphere, 5 g of trioctylphosphine oxide (TOPO) was added. When the temperature of the mixed solution was reduced to about 260° C., the mixed solution was reacted with TOPO to form CdSe nanocrystals. After the mixed solution had been reacted with TOPO for 70 minutes, the reaction solution was rapidly cooled to room temperature, and the reaction was stopped. Hereby, quantum dots composed of CdSe, that is, CdSe cores, were prepared.

The resulting reaction solution was subjected to a classification cycle consisting of the following three steps five times.

(i) Adding 10 ml of anhydrous ethanol, which is a poor solvent, to the reaction solution in order to precipitate the quantum dot phosphor (ii) Performing centrifugation at 4000 rpm for 10 minutes in order to cause settling of the quantum dot phosphor (iii) Adding dehydrated toluene to the reaction solution in order to redissolve the quantum dot phosphor Through the above classification cycles, CdSe cores were synthesized in the reaction solution. That is, a CdSe core solution was prepared.

Subsequently, ZnS shells were synthesized. To the CdSe core solution synthesized by the above-described method, 3 ml of a TOP solution containing 3 mmol of zinc acetate and 3 mmol of sulfur, which are the materials for the shell layers, was added. The resulting mixture was reacted at 150° C. for 2 hours and subsequently cooled to room temperature. Hereby, a dispersion liquid containing CdSe/ZnS quantum dot phosphor particles was prepared. The dispersion liquid was subjected to the cycles of steps (i) to (iii) above while the amount of dehydrated toluene was adjusted. Hereby, a quantum dot phosphor-containing solution in which 5-weight % CdSe/ZnS quantum dot phosphor was prepared.

The emission spectrum of the CdSe/ZnS quantum dots prepared in the above-described manner was measured. Specifically, the quantum dot phosphor-containing solution was charged into a quartz cell having a width of 10 mm, a length of 10 mm, and a depth of 50 mm. The emission spectrum of the CdSe/ZnS quantum dots charged in the quartz cell which occurred upon the CdSe/ZnS quantum dots being excited by light with a wavelength of 445 nm was measured with a spectrofluorometer "Fluoromax4" produced by Horiba, Ltd.

In FIG. 4, the emission spectrum of the quantum dot phosphor is denoted by the solid line. An analysis of the emission spectrum illustrated in FIG. 4 confirms that the emission spectrum of the quantum dot phosphor had a peak wavelength of 535 nm and a half-width of 35 nm.

While the wavelength of the excitation light was changed, the emission intensity of the quantum dot phosphor at the peak wavelength of 535 nm was plotted against the excitation wavelength in order to form the excitation spectrum shown in FIG. 4 by a dashed line.

In order to bond the ionic surface-modifying molecules 13a to the surface of the green phosphor 13, for example, subsequent to the preparation of the dispersion liquid containing the CdSe/ZnS quantum dot phosphor in the above production example, 1 mL of water containing 50 mg of 2-(diethylamino)ethanethiol hydrochloride, which serves as the ionic surface-modifying molecules 13a, may be mixed with the dispersion liquid. In such a case, a dispersion liquid containing a CdSe/ZnS quantum dot phosphor including 2-(diethylamino) ethanethiol bonded to the surfaces of the CdSe/ZnS quantum dots can be prepared.

Examples and Comparative Examples of Light Emitting Device 10

Example D1

In Example D1, a specific example of the light emitting device 10 illustrated in FIG. 1 is described.

With 1 g of a solution containing 2-(methacryloyloxy)-ethyltrimethylammonium bis(trifluoromethanesulfonyl)imide, which is the ionic liquid including a (meth)acrylic acid ester group, 115 mg of the quantum dot-containing solution containing 5-weight % CdSe/ZnS green phosphor 13, which was prepared in the above production example, was mixed. Hereby, a CdSe/ZnS-containing ionic liquid was prepared. With the CdSe/ZnS-containing ionic liquid, (i) 1.4 mg of azobisisobutyronitrile which serves as a polymerization initiator, and (ii) 140 mg of the red phosphor 12 prepared in the above production example were mixed. Hereby, a phosphor-containing resin including the red phosphor 12 and the green phosphor 13 dispersed therein was prepared.

A light emitting element 11 that was a blue LED having a peak emission wavelength of 445 nm was placed on a substrate 15. A resin frame 16 was arranged on the substrate 15 so as to surround the periphery of the light emitting element 11. The phosphor-containing resin was charged inside the resin frame 16 and left to stand at room temperature for 24 hours in order to cause settling of only the red phosphor 12. Subsequently, the phosphor-containing resin was cured by being heated at 80° C. for 1 hour. By the above process, a light emitting device 10 in which the green phosphor 13 and the red phosphor 12 were dispersed in the transparent resin 14 and the red phosphor 12 was arranged to be in contact with the light emitting element 11 and the substrate 15 as illustrated in FIG. 1 was prepared.

Figure 5:
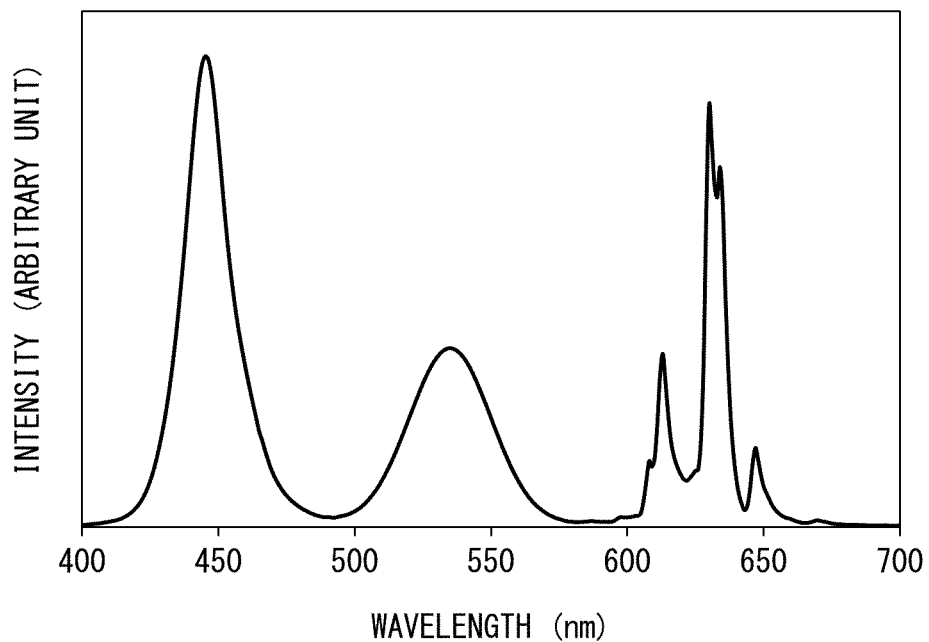
FIG. 5 is a graph illustrating the emission spectrum of a light emitting device prepared in an example of Embodiment 1.

FIG. 5 is a graph illustrating the emission spectrum of the light emitting device 10 prepared in Example D1. The emission spectrum illustrated in FIG. 5 is the emission spectrum of the light emitting device 10 driven at a driving current of 20 mA measured with a spectrometer "MCPD-7000" produced by Otsuka Electronics Co., Ltd. The chromaticity coordinates of light emitted from the light emitting device 10 prepared in Example D1 which were determined from the emission spectrum illustrated in FIG. 5 were (CIEx, CIEy)=(0.256, 0.224) on the CIE 1931 chromaticity diagram.

In Example D1, the proportions of the weights of the red phosphor 12 and the green phosphor 13 to the weight of the transparent resin 14 were adjusted such that the color temperature of the white point of light emitted from the light emitting device 10 and transmitted through the liquid crystal panel described below was about 10,000 K. In Examples other than Example D1 and Comparative examples below, the proportions of the weights of the red phosphor 12 and the green phosphor 13 to the weight of the transparent resin 14 were adjusted as in Example D1.

Specifically, the weight of the green phosphor 13 is preferably 1% to 25% and is more preferably 3% to 15% of the weight of transparent resin 14. The weight of the red phosphor 12 is preferably 1% to 60% and is more preferably 5% to 30% of the weight of transparent resin 14.

Example D2

Figure 6:
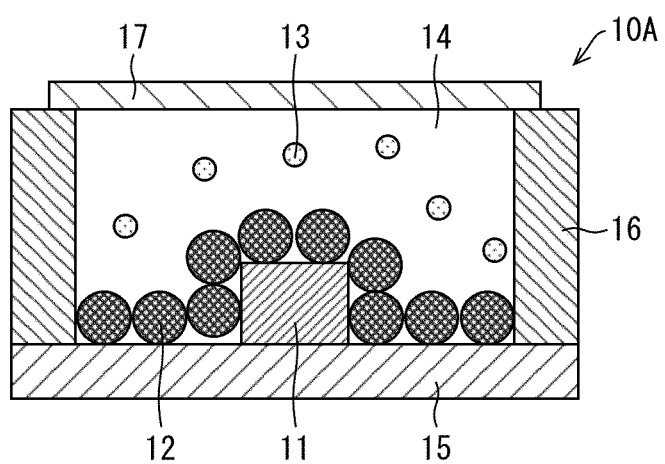
FIG. 6 is a cross-sectional view of a light emitting device according to a modification example of Embodiment 1.

FIG. 6 is a cross-sectional view of a light emitting device 10A according to a modification example of Embodiment 1. As illustrated in FIG. 6, the light emitting device 10A has the same structure as the light emitting device 10 and further includes a glass plate 17. In Example D2, a specific example of the light emitting device 10A is described.

First, a light emitting device 10 was prepared as in Example D1. A glass plate 17 having a shape suitable for covering the opening of the resin frame 16 was attached to the opening. Subsequently, the light emitting device 10 was heated at 80° C. for 1 hour. Hereby, a light emitting device 10A was prepared.

The glass plate 17 serves as a gas-barrier layer that prevents the contact of the transparent resin 14 with air and the like. The glass plate 17 is merely an example of such a gas-barrier layer and may be replaced with a member composed of a translucent substance other than glass.

Comparative Example D1

Figures 7, 8:
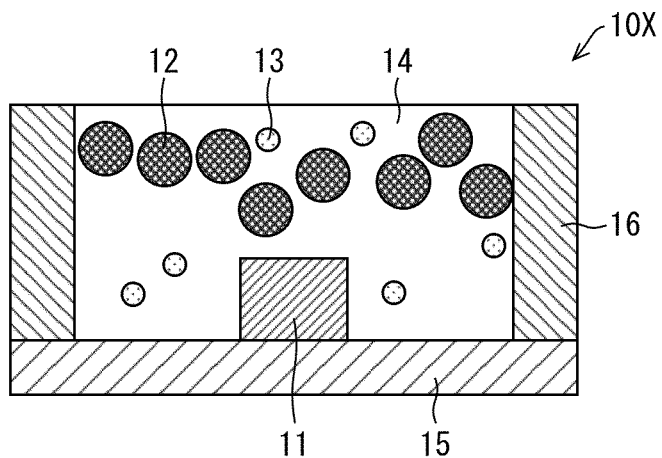
FIG. 7 is a cross-sectional view of a light emitting device prepared in Comparative example D1 of Embodiment 1.
FIG. 8 is a table summarizing the results of a test of light emitting devices prepared in Examples and Comparative examples of Embodiment 1.

FIG. 7 is a cross-sectional view of a light emitting device 10X prepared in Comparative example D1. As illustrated in FIG. 7, the light emitting device 10X differs from the light emitting device 10 in that the red phosphor 12 is arranged not to be in contact with the light emitting element 11 and the substrate 15.

The method for preparing the light emitting device 10X is described below. With 1 g of a solution containing 2-(methacryloyloxy)-ethyltrimethylammonium bis(trifluoromethanesulfonyl)imide, which is an ionic liquid including a (meth)acrylic acid ester group, 115 mg of the quantum dot-containing solution containing 5-weight % CdSe/ZnS quantum dot phosphor, which was prepared in the above production example, was mixed. Hereby, a CdSe/ZnS-containing ionic liquid was prepared.

With the CdSe/ZnS-containing ionic liquid, 1.4 mg of azobisisobutyronitrile which serves as a polymerization initiator was mixed. Hereby, a quantum dot-containing resin was prepared. The quantum dot-containing resin was charged inside the resin frame 16 so as to cover the light emitting element 11 and then heated at 80° C. for 30 minutes. Subsequently, 160 mg of the $Mn^{4+}$-activated fluorine complex phosphor was added to the quantum dot-containing resin. The resulting mixture was again charged inside the resin frame 16 and then heated at 80° C. for 30 minutes. Hereby, a light emitting device 10X was prepared.

Comparative Example D2

A method for preparing a light emitting device in Comparative example D2, which is other than the method used in Comparative example D1, is described below. With 1 g of a silicone resin "KER-2500" produced by Shin-Etsu Chemical Co., Ltd., 139 mg of the $Mn^{4+}$ fluorine complex phosphor prepared in the production example of $Mn^{4+}$ fluorine complex phosphor was mixed. With 100 parts by weight of the resulting resin composition (silicone resin+red phosphor), 10 parts by weight of a quantum dot-containing solution containing 5-weight % CdSe/ZnS quantum dot phosphor, which was prepared in the above production example of quantum dot phosphor, was mixed. Hereby, a phosphor-containing resin was prepared.

A blue LED having a peak emission wavelength of 445 nm, which served as a light emitting element 11, was placed on a substrate 15. A resin frame 16 was arranged on the substrate 15 so as to surround the periphery of the light emitting element 11. The phosphor-containing resin was charged inside the resin frame 16 and left to stand at room temperature for 24 hours. Subsequently, the phosphor-containing resin was heated at 80° C. for 30 minutes and then at 120° C. for another 1 hour in order to cure the phosphor-containing resin. Hereby, a light emitting device was prepared. The light emitting device had the same structure as light emitting device 10 illustrated in FIG. 1, except that a silicone resin was used instead of the transparent resin 14.

Evaluation of Luminous Efficiency of Light Emitting Device

The light emitting devices prepared in Examples D1 and D2 and Comparative examples D1 and D2 were subjected to the test described below. Specifically, the light emitting devices prepared in Examples D1 and D2 and Comparative examples D1 and D2 were operated up to 500 hours with a driving current of 20 mA, and the initial luminous flux of each of the light emitting devices and the amount of time required for the luminous flux of the light emitting device to decrease to 50% of the luminous flux at the start of operation, that is, the initial luminous flux (hereinafter, this period of time is referred to as "luminous flux half-time") were measured.

FIG. 8 is a table summarizing the results of the test. In the table shown in FIG. 8, the initial luminous fluxes of the light emitting devices are expressed as relative values with the initial luminous flux of the light emitting device prepared in Example D1 being 100. As illustrated in FIG. 8, the light emitting devices prepared in Examples D1 and D2 had a markedly longer luminous flux half-time than those prepared in Comparative examples D1 and D2. This is because, in Examples D1 and D2, using a transparent resin including the ionic liquid or a derivative of the ionic liquid as the transparent resin 14 and arranging the red phosphor 12 so as to be deposited on the light emitting element 11 and the substrate 15 reduced the following:

Degradation of the green phosphor 13 by heat

Degradation of metal parts included in the light emitting element 11 and the substrate 15 due to chemical reaction between the metal parts and the ionic liquid In particular, the luminous flux half-time of the light emitting device 10A prepared in Example D2 is double the luminous flux half-time of the light emitting device 10 prepared in Example D1. This is because the glass plate 17 included in the light emitting device 10A reduced the contact of the transparent resin 14 with outside air and, in turn, the likelihood of the green phosphor 13 included in the transparent resin 14 becoming degraded by the contact with outside air.

The initial luminous flux and the luminous flux half-time of the light emitting device prepared in Comparative example D2 are significantly poor compared with not only Examples D1 and D2 but also Comparative example D1. This is because, in Comparative example D2, using a silicone resin as the transparent resin included in the light emitting device reduced the chemical stability of the interface between the transparent resin 14 and the green phosphor 13 and caused rapid degradation of the green phosphor 13 during the production and operation of the light emitting device.

Advantageous Effects of Light Emitting Device 10

As described above, in the light emitting device 10 according to Embodiment 1, the green phosphor 13 is dispersed in the transparent resin 14. The transparent resin 14 includes a constitutional unit including an ionic liquid including a polymerizable functional group or a derivative of the ionic liquid. Therefore, the transparent resin 14 is stable to heat and has a high affinity for the green phosphor 13 that is a quantum dot phosphor. This makes the interface between the green phosphor 13 and the transparent resin 14 chemically stable and reduces the degradation of the green phosphor 13.

In the light emitting device 10 according to Embodiment 1, the red phosphor 12 is arranged to be in contact with the light emitting element 11 and the substrate 15. This reduces the area of a portion of the transparent resin 14 which comes into contact with metal parts included in the light emitting element 11 and the substrate 15 and, consequently, inhibits the reaction between the metal parts and the transparent resin 14. In addition, the heat generated in the red phosphor 12 can be dissipated from the light emitting element 11 and the substrate 15. This reduces the amount of heat transferred to the green phosphor 13 and, accordingly, limits the degradation of the green phosphor 13 by heat.

Embodiment 2

Another embodiment of the disclosure is described below with reference to FIGS. 9A to 11B. In Embodiment 2, an image displaying system that includes the light emitting device according to Embodiment 1 is described. Hereinafter, components that have substantially the same function as in Embodiment 1 are denoted by the same reference numeral as in Embodiment 1, and the description thereof may be omitted for the sake of simplicity.

Figure 9A:
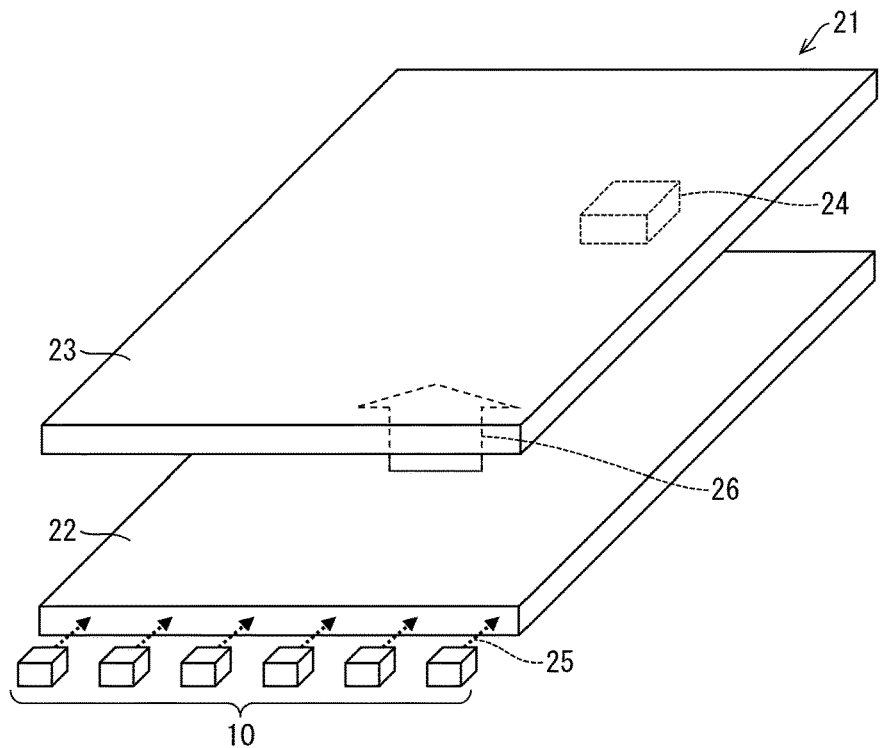
FIG. 9A is an exploded perspective view of an image displaying system according to Embodiment 2.
Figure 9B:
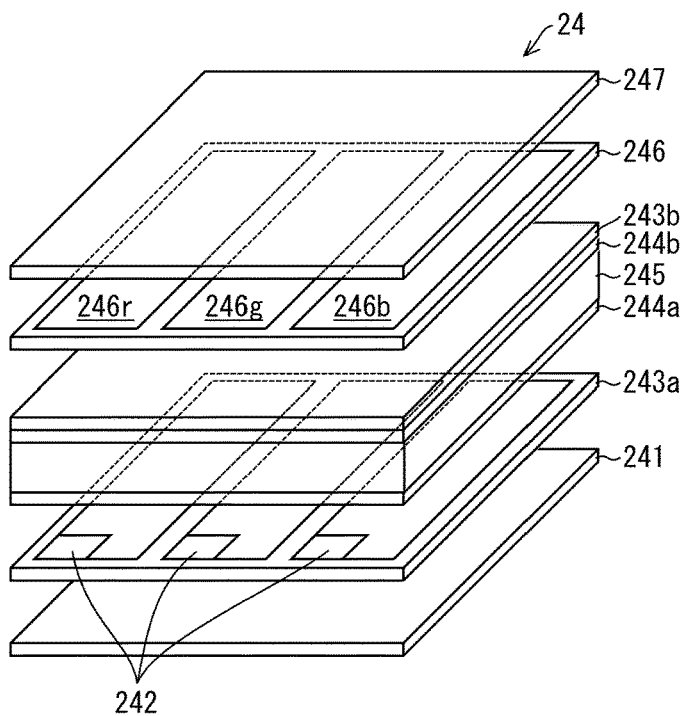
FIG. 9B is an exploded perspective view of a liquid crystal display included in the image displaying system illustrated in FIG. 9A.
Figures 10, 11A:
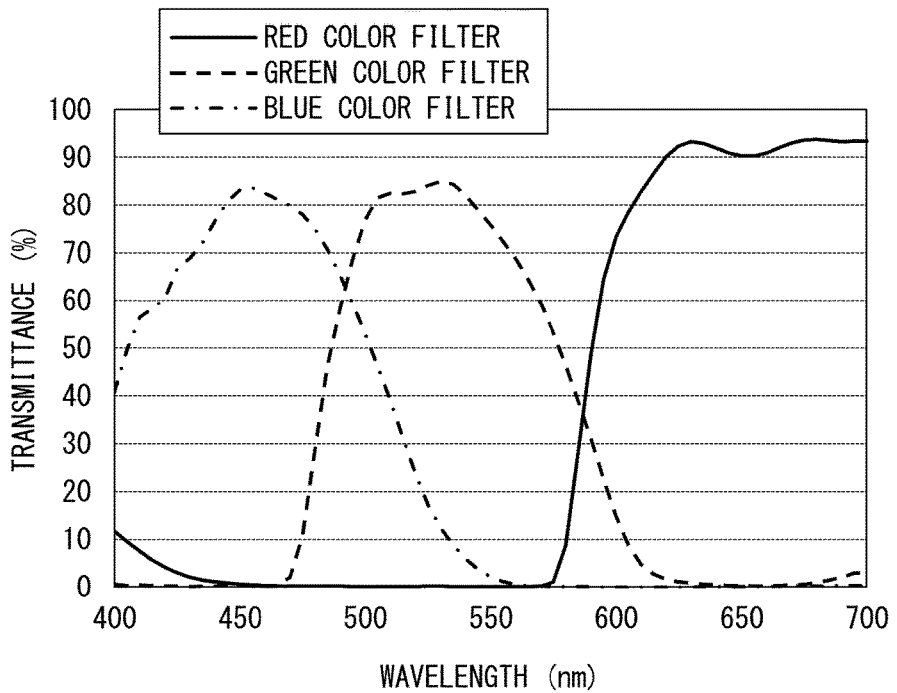
FIG. 10 is a graph illustrating the transmission spectrum of a color filter included in an image displaying system.
FIG. 11A is a table summarizing the color temperature of the white point of an image displaying system prepared in Example DIS1, the chromaticity coordinates of the white, red, green, and blue points of the image displaying system on the CIE 1931 chromaticity diagram, and the AdobeRGB coverage of the image displaying system.

FIG. 9A is an exploded perspective view of an image displaying system 21 according to Embodiment 2. FIG. 9B is an exploded perspective view of a liquid crystal display 24 included in the image displaying system 21 illustrated in FIG. 9A. FIG. 10 is a graph illustrating the transmission spectrum of a color filter 246 included in the image displaying system 21.

As illustrated in FIG. 9A, the image displaying system 21 includes light emitting devices 10, a light guide plate 22, and a liquid crystal display area 23. The light guide plate 22 is a transparent or semi-transparent light guide plate. The liquid crystal display area 23 is a display area on which an image is displayed and includes plural liquid crystal display cells 24.

The image displaying system 21 includes a plurality of the light emitting devices 10 disposed on a side surface of the light guide plate 22. The liquid crystal display area 23 is arranged to be adjacent to the light guide plate 22. Light 25 emitted from the light emitting devices 10 are scattered inside the light guide plate 22 to form scattered light 26, with which the entire surface of the liquid crystal display area 23 is irradiated.

As described in Embodiment 1, the light emitting device 10 is capable of limiting a reduction in luminous efficiency. Accordingly, the image displaying system 21 that includes the light emitting devices 10 is capable of limiting a reduction in luminous efficiency. The image displaying system 21 may include the light emitting device 10A instead of the light emitting device 10.

Liquid Crystal Display Cells 24

As illustrated in FIG. 9B, each of the liquid crystal display cells 24 that constitute the liquid crystal display area 23 includes a polarizer 241, a transparent conductive film 243a that includes thin-film transistors 242, an orientation membrane 244a, a liquid crystal layer 245, an orientation membrane 244b, an upper thin-film electrode 243b, a color filter 246 for color pixel display, and an upper polarizer 247, which are stacked on top of one another.

The color filter 246 is divided into segments having a size corresponding to the size of the pixels formed in the transparent conductive film 243a. The color filter 246 includes a red color filter 246r, a green color filter 246g, and a blue color filter 246b that transmit red light, green light, and blue light, respectively.

The image displaying system 21 according to Embodiment 2 may include the red, green, and blue color filters that transmit red light, green light, and blue light, respectively, as in the color filter 246 illustrated in FIG. 9B. In such a case, for example, red, blue, and green color filters having the respective transmission spectra illustrated in FIG. 10 may be suitably used. The red, blue, and green color filters having the respective transmission spectra illustrated in FIG. 10 were used in Example DIS1 below.

Example of Image Displaying System 21

Example DIS1

Figure 11B:
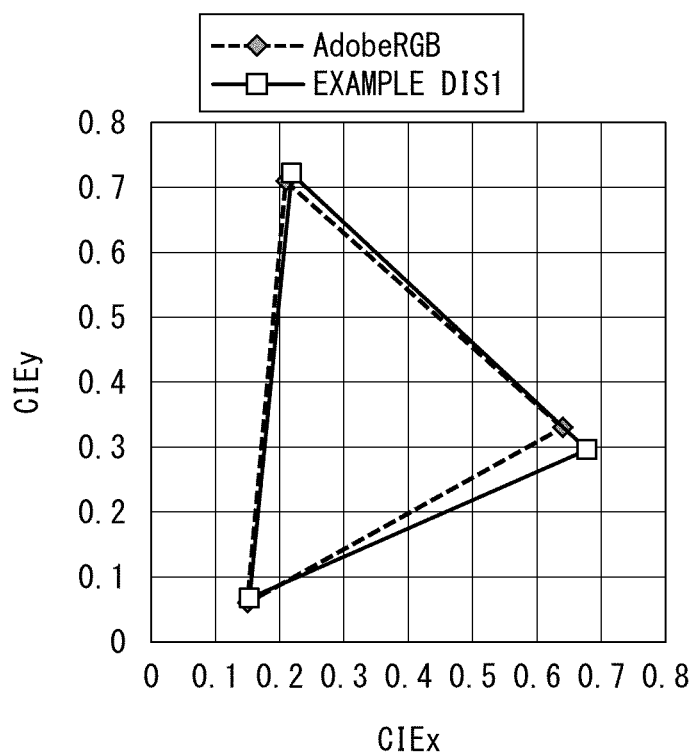
FIG. 11B is a graph illustrating a comparison between the gamut of an image displaying system prepared in Example DIS1 and the AdobeRGB gamut.

A specific example of the image displaying system 21 illustrated in FIG. 9A was prepared in Example DIS1. FIG. 11A is a table showing the color temperature of the white point of the image displaying system 21 prepared in Example DIS1, the chromaticity coordinates of the white, red, green, and blue points of the image displaying system 21 on the CIE 1931 chromaticity diagram, and the AdobeRGB coverage of the image displaying system 21. FIG. 11B is a graph illustrating a comparison between the gamut of the image displaying system 21 prepared in Example DIS1 and the AdobeRGB gamut.

In the table shown in FIG. 11A, the term "red point" refers to the chromaticity point of a display on which only the light that transmits the red color filter is displayed, the term "green point" refers to the chromaticity point of a display on which only the light that transmits the green color filter is displayed, the term "blue point" refers to the chromaticity point of a display on which only the light that transmits the blue color filter is displayed, and the term "white point" refers to the chromaticity point of a display on which all of the light that transmits the red color filter, the light that transmits the green color filter, and the light that transmits the blue color filter are displayed simultaneously. The term "AdobeRGB coverage" refers to the ratio of the area of the gamut bordered with the triangle defined by the above red, green, and blue points to the area of the AdobeRGB gamut.

As shown in FIGS. 11A and 11B, the AdobeRGB coverage of the image displaying system 21 prepared in Example DIS1 was 97.7%, which is markedly high.

Embodiment 3

Embodiment 3 is described below. In Embodiment 3, a light emitting device other than the light emitting device described in Embodiment 1 is described. The light emitting device according to Embodiment 3 includes the same components as the light emitting device 10 above except the light emitting element 11, and the description of the components is omitted.

In the light emitting device according to Embodiment 3, the primary light emitted from the light emitting element has a peak wavelength of about 420 nm or more and about 440 nm or less. Even when the light emitting device includes a light emitting element that emits primary light having such a peak wavelength, an image displaying system that includes the light emitting device has a wide color reproduction area.

However, in the light emitting device 10 according to Embodiment 1, the peak wavelength of primary light emitted from the light emitting element 11, the excitation spectrum of the red phosphor 12 illustrated in FIG. 3, and the transmission spectrum of the blue color filter 246b illustrated in FIG. 10 are coherent with one another. Accordingly, the light emitting device 10 according to Embodiment 1 has a higher luminous efficiency than the light emitting device according to Embodiment 3.

Embodiment 4

Embodiment 4 is described below. In Embodiment 4, a light emitting device other than the light emitting device described in Embodiment 1 is described. The light emitting device according to Embodiment 4 includes the same components as the light emitting device 10 above except the green phosphor 13, and the description of the components is omitted.

In the light emitting device according to Embodiment 4, commercial InP quantum dots having an emission spectrum with a peak wavelength of 525 nm and a half-width of 65 nm are used as green phosphor particles, instead of CdSe/ZnS semiconductor nanoparticles.

The emission spectrum of the InP quantum dots has a wider half-width than the emission spectrum of the CdSe/ZnS semiconductor nanoparticles. Accordingly, an image displaying system that includes the light emitting device according to Embodiment 4 has lower color reproducibility than an image displaying system that includes the light emitting device 10.

However, since InP quantum dots do not contain Cd, the light emitting device according to Embodiment 4 may cause a lower environmental load than the light emitting device 10.

Conclusion

A light emitting device (10) according to a first aspect of the disclosure includes a light emitting element (11) that emits blue light; a substrate (15) provided with the light emitting element disposed thereon; a quantum dot phosphor (green phosphor 13) that emits green light upon being excited by the blue light; a $Mn^{4+}$-activated fluorine complex phosphor (red phosphor 12) that emits red light upon being excited by the blue light; and a transparent resin (14) including the light emitting element, the quantum dot phosphor, and the $Mn^{4+}$-activated fluorine complex phosphor, the light emitting element being disposed inside the transparent resin, the quantum dot phosphor and the $Mn^{4+}$-activated fluorine complex phosphor being dispersed in the transparent resin, the $Mn^{4+}$-activated fluorine complex phosphor being arranged to be in contact with the light emitting element and the substrate, the transparent resin including a constitutional unit including an ionic liquid (14A) including a polymerizable functional group or a derivative of the ionic liquid.

In the above-described light emitting device, the quantum dot phosphor is dispersed in a transparent resin that includes a constitutional unit including an ionic liquid including a polymerizable functional group or a derivative of the ionic liquid. Such a transparent resin is stable to heat and has a high affinity for the quantum dot phosphor. Consequently, the interface between the quantum dot phosphor and the transparent resin is chemically stable.

In the above-described light emitting device, the $Mn^{4+}$-activated fluorine complex phosphor is arranged to be in contact with the light emitting element and the substrate. This allows part of the heat generated in the $Mn^{4+}$-activated fluorine complex phosphor to be dissipated from the light emitting element and the substrate and reduces the likelihood of the heat transferring to the quantum dot phosphor. Consequently, the degradation of the quantum dot phosphor by chemical reaction or heat may be reduced.

According to a second aspect of the disclosure, in the light emitting device according to the first aspect, the polymerizable functional group may be a (meth)acrylic acid ester group.

In such a case, the ionic liquid including a polymerizable functional group can be polymerized by heating or by using a catalyst. This enables the ionic liquid to be polymerized and solidified while the quantum dot phosphor is dispersed in the ionic liquid in a stable manner.

According to a third aspect of the disclosure, in the light emitting device according to the second aspect, the ionic liquid including a (meth)acrylic acid ester group may be 2-(methacryloyloxy)-ethyltrimethylammonium bis(trifluoromethanesulfonyl)imide or 1-(3-acryloyloxy-propyl)-3-methylimidazolium bis(trifluoromethanesulfonyl)imide.

In such a case, the ionic liquid may have high stability to heat and air. This facilitates the production of the light emitting device.

According to a fourth aspect of the disclosure, in the light emitting device according to any one of the first to third aspects, the quantum dot phosphor may be provided with an ionic surface-modifying molecule (13a) bonded to a surface thereof.

In such a case, the quantum dot phosphor can be firmly protected while being electrostatistically stabilized in the transparent resin. This may reduce the likelihood of the ionic surface-modifying molecules becoming detached from the surface of the quantum dot phosphor by heat and, consequently, limit the degradation of the quantum dot phosphor.

According to a fifth aspect of the disclosure, in the light emitting device according to the fourth aspect, the ionic surface-modifying molecule may be any one selected from the group consisting of 2-(diethylamino)ethanethiol hydrochloride, hexadecyltrimethylammonium bromide, myristyltrimethylammonium bromide, and thiocholine bromide.

In such a case, the ionic surface-modifying molecules may be bonded to the quantum dot phosphor with stability.

According to a sixth aspect of the disclosure, in the light emitting device according to any one of the first to fifth aspects, the $Mn^{4+}$-activated fluorine complex phosphor may have a particle diameter of about 10 μm or more and about 100 μm or less.

In such a case, since the particle diameter of the $Mn^{4+}$-activated fluorine complex phosphor is about 10 μm or more, it becomes easy to settle the $Mn^{4+}$-activated fluorine complex phosphor in the ionic liquid in the formation of the transparent resin. Furthermore, since the particle diameter of the $Mn^{4+}$-activated fluorine complex phosphor is about 100 μm or less, a reduction in the production yield of the $Mn^{4+}$-activated fluorine complex phosphor may be limited.

According to a seventh aspect of the disclosure, in the light emitting device according to the sixth aspect, the particle diameter of the $Mn^{4+}$-activated fluorine complex phosphor may be about 30 μm or more and about 100 μm or less.

In such a case, since the particle diameter of the $Mn^{4+}$-activated fluorine complex phosphor is about 30 μm or more, the likelihood of the $Mn^{4+}$-activated fluorine complex phosphor becoming settled in the ionic liquid in the formation of the transparent resin may be further increased.

According to an eighth aspect of the disclosure, in the light emitting device according to any one of the first to seventh aspects, the quantum dot phosphor may have an emission spectrum with a peak wavelength of about 520 nm or more and about 540 nm or less.

In such a case, an image displaying system that includes the light emitting device may have a wide color reproduction area.

According to a ninth aspect of the disclosure, in the light emitting device according to any one of the first to eighth aspects, the emission spectrum of the quantum dot phosphor may have a half-width of about 25 nm or more.

In such a case, the range of acceptable fluctuations in the size of the quantum dot phosphor may be widened and, consequently, the production yield of the quantum dot phosphor may be increased.

According to a tenth aspect of the disclosure, in the light emitting device according to any one of the first to ninth aspects, the $Mn^{4+}$-activated fluorine complex phosphor may have an emission spectrum with a half-width of about 10 nm or less.

In such a case, an image displaying system that includes the light emitting device may have enhanced color reproducibility.

According to an eleventh aspect of the disclosure, in the light emitting device according to any one of the first to tenth aspects, the quantum dot phosphor may be composed primarily of any one selected from CdSe, CdS, CdTe, InP, InN, AlInN, InGaN, AlGaInN, and CuInGaSe.

In such a case, the quantum dot phosphor is composed of a material capable of emitting visible light with efficiency.

According to a twelfth aspect of the disclosure, in the light emitting device according to any one of the first to eleventh aspects, the $Mn^{4+}$-activated fluorine complex phosphor may be represented by $MI_2(MII_{1-h}Mn_h)F_6$, where MI represents at least one alkali metal element selected from Li, Na, K, Rb, and Cs; MII represents at least one tetravalent metal element selected from Ge, Si, Sn, Ti, and Zr; and h is about 0.001 or more and about 0.1 or less.

In such a case, the concentration of $Mn^{4+}$ ions, which is determined by h, may be sufficient and adequate. This increases the emission intensity of the $Mn^{4+}$-activated fluorine complex phosphor.

According to a thirteenth aspect of the disclosure, in the light emitting device according to the twelfth aspect, the $Mn^{4+}$-activated fluorine complex phosphor may be represented by $K_2(Si_{1-h}Mn_h)F_6$.

In such a case, the $Mn^{4+}$-activated fluorine complex phosphor may have (i) a high emission intensity, (ii) high stability of phosphor crystals, and (iii) high water resistance.

According to a fourteenth aspect of the disclosure, in the light emitting device according to any one of the first to eleventh aspects, the $Mn^{4+}$-activated fluorine complex phosphor may be represented by $MIII(MII_{1-h}Mn_h)F_6$, where MIII represents at least one alkaline-earth metal element selected from Mg, Ca, Sr, and Ba; MII represents at least one tetravalent metal element selected from Ge, Si, Sn, Ti, and Zr; and h is about 0.001 or more and about 0.1 or less.

In such a case, as in the twelfth aspect, the concentration of $Mn^{4+}$ ions, which is determined by h, may be sufficient and adequate. This increases the emission intensity of the $Mn^{4+}$-activated fluorine complex phosphor.

According to a fifteenth aspect of the disclosure, in the light emitting device according to the fourteenth aspect, the $Mn^{4+}$-activated fluorine complex phosphor may be represented by $Ba(Si_{1-h}Mn_h)F_6$.

In such a case, the $Mn^{4+}$-activated fluorine complex phosphor may have (i) a high luminous efficiency, (ii) high resistance to degradation due to heat or external forces, and (iii) high water resistance.

According to a sixteenth aspect of the disclosure, in the light emitting device according to any one of the first to fifteenth aspects, the blue light may have a peak wavelength of about 420 nm or more and about 480 nm or less.

In such a case, the luminous efficiency of the light emitting element may be increased and, in turn, the light emitting device may have a high luminous efficiency.

According to a seventeenth aspect of the disclosure, in the light emitting device according to the sixteenth aspect, the peak wavelength of the blue light may be about 440 nm or more and about 460 nm or less.

In such a case, the luminous efficiency of the light emitting element may be further increased. In addition, the light emitted from the light emitting element, the excitation spectrum of the red phosphor, and the transmission spectrum of the blue color filter are coherent with one another. This may further increase the luminous efficiency of the light emitting device.

An image displaying system (21) according to an eighteenth aspect of the disclosure includes the light emitting device according to any one of the first to seventeenth aspects.

The above-described image displaying system has high color reproducibility.

The aspects of the disclosure are not limited by the above-described embodiments and various modification may be made within the scope of the following claims. An embodiment made by combining the technologies disclosed in different embodiments may be included in the scope of the aspects of the disclosure. A new technical feature may be created by combining the technologies disclosed in different embodiments.

Another Expression of the Disclosure

The aspects of the disclosure may be expressed as follows.

Specifically, a light emitting device according to an aspect of the disclosure includes a light emitting element that emits blue light; a substrate including a metal electrode, the substrate being provided with the light emitting element disposed thereon; a $Mn^{4+}$-activated fluorine complex phosphor that emits red light upon being excited by the blue light; a quantum dot phosphor that emits green light upon being excited by the blue light; and a transparent resin including a constitutional unit including an ionic liquid including a polymerizable functional group or a derivative of the ionic liquid, the light emitting element, the $Mn^{4+}$-activated fluorine complex phosphor, and the quantum dot phosphor being disposed inside the resin, the quantum dot phosphor being dispersed in the transparent resin, the $Mn^{4+}$-activated fluorine complex phosphor (integrally) covering the light emitting element and the substrate.

In a light emitting device according to another aspect of the disclosure, the polymerizable functional group is a (meth)acrylic acid ester group.

In a light emitting device according to still another aspect of the disclosure, the ionic liquid including a (meth)acrylic acid ester group is 2-(methacryloyloxy)-ethyltrimethylammonium bis(trifluoromethanesulfonyl)imide or 1-(3-acryloyloxy-propyl)-3-methylimidazolium bis(trifluoromethanesulfonyl)imide.

In a light emitting device according to yet another aspect of the disclosure, the quantum dot phosphor has an emission spectrum with a peak wavelength of about 520 nm or more and about 540 nm or less.

In a light emitting device according to another aspect of the disclosure, the emission spectrum of the quantum dot phosphor has a half-width of about 25 nm or more.

In a light emitting device according to still another aspect of the disclosure, the quantum dot phosphor is provided with an ionic surface-modifying molecule bonded to a surface thereof.

In a light emitting device according to yet another aspect of the disclosure, the ionic surface-modifying molecule is any one selected from the group consisting of 2-(diethylamino)ethanethiol hydrochloride, hexadecyltrimethylammonium bromide, myristyltrimethylammonium bromide, and thiocholine bromide.

In a light emitting device according to another aspect of the disclosure, the $Mn^{4+}$-activated fluorine complex phosphor has an emission spectrum with a half-width of about 10 nm or less.

In a light emitting device according to still another aspect of the disclosure, the quantum dot phosphor is composed primarily of any one selected from CdSe, CdS, CdTe, InP, InN, AlInN, InGaN, AlGaInN, and CuInGaSe.

In a light emitting device according to yet another aspect of the disclosure, the $Mn^{4+}$-activated fluorine complex phosphor is represented by $MI_2(MII_{1-h}Mn_h)F_6$, where MI represents at least one alkali metal element selected from Li, Na, K, Rb, and Cs; MII represents at least one tetravalent metal element selected from Ge, Si, Sn, Ti, and Zr; and h is about 0.001 or more and about 0.1 or less.

In a light emitting device according to another aspect of the disclosure, the $Mn^{4+}$-activated fluorine complex phosphor is represented by $K_2(Si_{1-h}Mn_h)F_6$.

In a light emitting device according to still another aspect of the disclosure, the $Mn^{4+}$-activated fluorine complex phosphor is represented by $MIII(MII_{1-h}Mn_h)F_6$, where MIII represents at least one alkaline-earth metal element selected from Mg, Ca, Sr, and Ba; MII represents at least one tetravalent metal element selected from Ge, Si, Sn, Ti, and Zr; and h is about 0.001 or more and about 0.1 or less.

In a light emitting device according to yet another aspect of the disclosure, the $Mn^{4+}$-activated fluorine complex phosphor is represented by $Ba(Si_{1-h}Mn_h)F_6$.

In a light emitting device according to another aspect of the disclosure, the blue light has a peak wavelength of about 420 nm or more and about 480 nm or less.

In a light emitting device according to still another aspect of the disclosure, the peak wavelength of the blue light is about 440 nm or more and about 460 nm or less.

An image displaying system according to yet another aspect of the disclosure includes the light emitting device according to any one of the above aspects of the disclosure.

The present disclosure contains subject matter related to that disclosed in Japanese Priority Patent Application JP 2017-030232 filed in the Japan Patent Office on Feb. 21, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device comprising:
   a light emitting element that emits blue light;
   a substrate provided with the light emitting element disposed thereon;
   a quantum dot phosphor that emits green light upon being excited by the blue light;
   a $Mn^{4+}$-activated fluorine complex phosphor that emits red light upon being excited by the blue light; and
   a transparent resin including the light emitting element, the quantum dot phosphor, and the $Mn^{4+}$-activated fluorine complex phosphor, the light emitting element being disposed inside the transparent resin, the quantum dot phosphor and the $Mn^{4+}$-activated fluorine complex phosphor being dispersed in the transparent resin,
   the $Mn^{4+}$-activated fluorine complex phosphor being arranged to be in contact with the light emitting element and the substrate,
   the transparent resin including a constitutional unit including an ionic liquid including a polymerizable functional group or a derivative of the ionic liquid.

2. The light emitting device according to claim 1, wherein the polymerizable functional group is a (meth)acrylic acid ester group.

3. The light emitting device according to claim 2, wherein the ionic liquid including a (meth)acrylic acid ester group is 2-(methacryloyloxy)-ethyltrimethylammonium bis(trifluoromethanesulfonyl)imide or 1-(3-acryloyloxy-propyl)-3-methylimidazolium bis(trifluoromethanesulfonyl)imide.

4. The light emitting device according to claim 1, wherein the quantum dot phosphor is provided with an ionic surface-modifying molecule bonded to a surface thereof.

5. The light emitting device according to claim 4, wherein the ionic surface-modifying molecule is any one selected from the group consisting of 2-(diethylamino)ethanethiol hydrochloride, hexadecyltrimethylammonium bromide, myristyltrimethylammonium bromide, and thiocholine bromide.

6. The light emitting device according to claim 1, wherein the $Mn^{4+}$-activated fluorine complex phosphor has a particle diameter of about 10 μm or more and about 100 μm or less.

7. The light emitting device according to claim 6, wherein the particle diameter of the $Mn^{4+}$-activated fluorine complex phosphor is about 30 μm or more and about 100 μm or less.

8. The light emitting device according to claim 1, wherein the quantum dot phosphor has an emission spectrum with a peak wavelength of about 520 nm or more and about 540 nm or less.

9. The light emitting device according to claim 1, wherein the emission spectrum of the quantum dot phosphor has a half-width of about 25 nm or more.

10. The light emitting device according to claim 1, wherein the $Mn^{4+}$-activated fluorine complex phosphor has an emission spectrum with a half-width of about 10 nm or less.

11. The light emitting device according to claim 1, wherein the quantum dot phosphor is composed primarily of any one selected from CdSe, CdS, CdTe, InP, InN, AlInN, InGaN, AlGaInN, and CuInGaSe.

12. The light emitting device according to claim 1, wherein the $Mn^{4+}$-activated fluorine complex phosphor is represented by $MI_2(MII_{1-h}Mn_h)F_6$, where:
MI represents at least one alkali metal element selected from Li, Na, K, Rb, and Cs;
MII represents at least one tetravalent metal element selected from Ge, Si, Sn, Ti, and Zr; and
h is about 0.001 or more and about 0.1 or less.

13. The light emitting device according to claim 12, wherein the $Mn^{4+}$-activated fluorine complex phosphor is represented by $K_2(Si_{1-h}Mn_h)F_6$.

14. The light emitting device according to claim 1, wherein the $Mn^{4+}$-activated fluorine complex phosphor is represented by $MIII(MII_{1-h}Mn_h)F_6$, where:
MIII represents at least one alkaline-earth metal element selected from Mg, Ca, Sr, and Ba;
MII represents at least one tetravalent metal element selected from Ge, Si, Sn, Ti, and Zr; and
h is about 0.001 or more and about 0.1 or less.

15. The light emitting device according to claim 14, wherein the $Mn^{4+}$-activated fluorine complex phosphor is represented by $Ba(Si_{1-h}Mn_h)F_6$.

16. The light emitting device according to claim 1, wherein the blue light has a peak wavelength of about 420 nm or more and about 480 nm or less.

17. The light emitting device according to claim 16, wherein the peak wavelength of the blue light is about 440 nm or more and about 460 nm or less.

18. An image displaying system comprising the light emitting device according to claim 1.

19. An image displaying system comprising the light emitting device according to claim 2.

20. An image displaying system comprising the light emitting device according to claim 3.

* * * * *